United States Patent [19]
Ort

[11] Patent Number: 4,472,629
[45] Date of Patent: Sep. 18, 1984

[54] OPTICAL ENCODER IMPROVEMENT
[75] Inventor: Donald L. Ort, Dallas, Tex.
[73] Assignee: Xerox Corporation, Stamford, Conn.
[21] Appl. No.: 347,214
[22] Filed: Feb. 9, 1982
[51] Int. Cl.³ .............................................. H01J 39/00
[52] U.S. Cl. ................................. 250/237 G; 307/471
[58] Field of Search .............. 340/347 P; 250/231 SE, 250/237 G; 307/514, 471; 328/133, 159; 455/608

[56] References Cited
U.S. PATENT DOCUMENTS

| | | | |
|---|---|---|---|
| 3,234,361 | 2/1966 | McLaren et al. | 340/347 P |
| 3,371,335 | 2/1968 | Seewald | 340/347 P |
| 3,633,038 | 1/1972 | Falk | 250/237 G |
| 3,995,222 | 11/1976 | Mitarai | 307/471 |
| 4,136,955 | 1/1979 | Aeschlimann et al. | 250/231 SE |
| 4,152,579 | 5/1979 | Feinland | 250/237 G |
| 4,184,071 | 1/1980 | Fryer et al. | 250/237 G |
| 4,246,497 | 1/1981 | Lawson et al. | 328/133 |
| 4,308,500 | 12/1981 | Avins | 340/347 P |
| 4,360,730 | 11/1982 | Breslow | 340/347 P |

Primary Examiner—Joseph A. Orsino, Jr.
Attorney, Agent, or Firm—Robert E. Cunha

[57] ABSTRACT

An optical position encoder system comprising a circuit for removing the electrical bias usually associated with the optical sensor outputs, and for generating a voltage output varying with the encoder position to produce an indication of angular or linear displacement between zero crossings is described. In one portion of the circuit, sensor output signals 180 degrees out of phase are subtracted to automatically cancel the bias. In another portion of the circuit, signals 90 degrees out of phase are used to generate a voltage, the amplitude of which is a function of the grid position between grid zero crossings. To accomplish these results, two or more angularly displaced grids are required.

6 Claims, 8 Drawing Figures

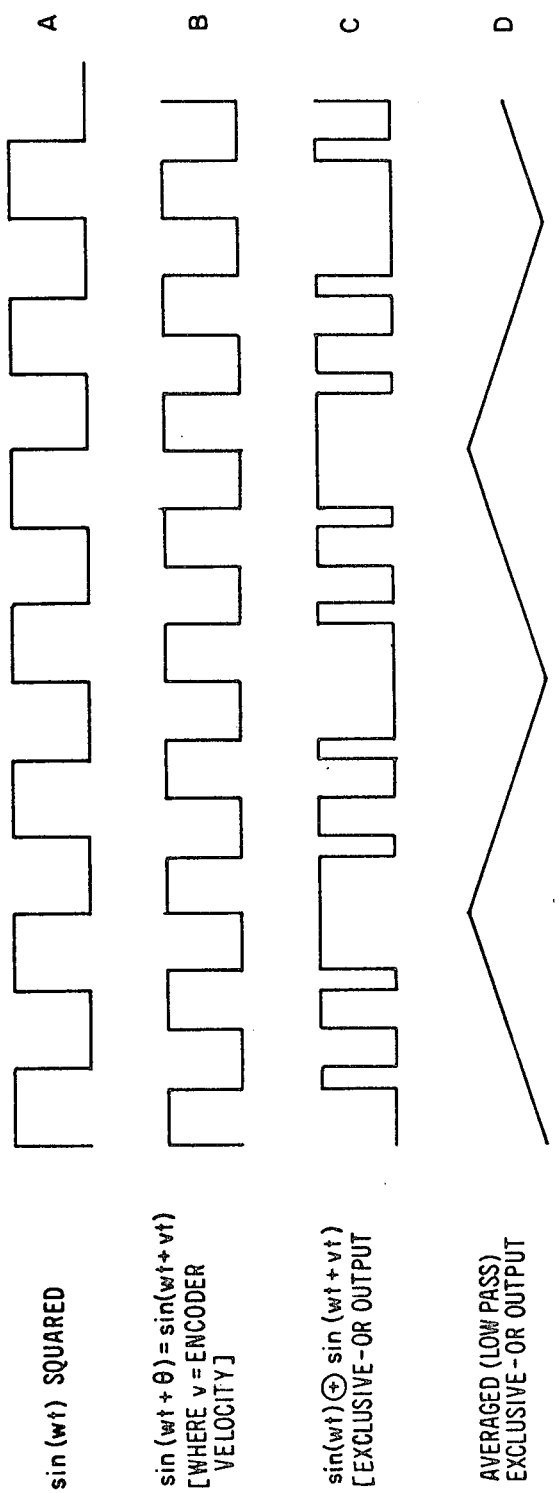

OPTICAL ENCODER IMPROVEMENT

This invention is an improved optical position encoder and more specifically comprises light sources, sensors, intervening optical grids and circuits for determining position to a fraction of the grid spacing dimension.

A typical optical incremental position encoder or transducer comprises a light source, two grid patterns (one fixed and one moveable) and a light sensor. As one grid moves relative to the other, an output signal is produced from the sensor consisting of a component containing the desired position information which usually resembles a distorted sinusoid, and a bias level produced by the general light level, the light leakage due to poor collimation, the pattern of the encoder grids, etc.

To isolate the information-bearing component, the bias level must be substracted. One method is to subtract a fixed voltage. However, due to changing optical, mechanical and temperature differences, the subtraction of a fixed voltage leads to an unacceptable error rate. This system can be improved by the inclusion of a feedback means to keep the light source output more constant.

Other methods of bias subtraction are to average the signal over a motion scan of the grids or to monitor the light level, usually through an unpatterned area of the grid, with a second sensor.

Such an encoder is used to determine position with a resolution of one-half the grid pattern periodicity. Usually, after subtraction of the bias level, signal zero crossings are counted as the grids are moved away from some reference position.

The encoder voltage output is continuously variable between zero crossings but this voltage cannot be used to estimate position between crossings because the signal is ambiguous in that there are two grid positions within each period that will yield the same output signal, and the amplitude of the signal which would be used to derive the position estimate is sensitive to many error factors.

Direction of motion also cannot be readily sensed by such an encoder. If the grid motion is started from a stopped position, there is no effective way to determine the direction of the movement.

More expensive optical encoders overcome the signal ambiguity to provide some indication of position with a granularity smaller than the grid pattern period, and, simultaneously give a direction indication. They do this by dividing the pattern on one of the grids into two parts. The pattern in the second part is shifted 90° in phase (spatial phase at the periodicity of the grid pattern) relative to the first part. The light intensity passing through each part is sensed by a separate sensor to yield electrical signals that are approximately proportional to the sine and the cosine, respectively, of the grid position, within the pattern periodicity. This sine and cosine can be logically combined to eliminate the signal ambiguity, and indicate motion direction.

The output position estimation is still, however, sensitive to parameters which cause the light intensity to vary. Therefore, any factors which effect light levels, or which distort the expected function relating encoder light transmission to encoder grid position, can cause errors in the estimate of position. Because of this, usually only the zero crossings of the sine and cosine signals are used. These zero crossings still give direction indication, but provide a resolution only to one-fourth of the grid periodicity.

Thus, in order to obtain high resolution, encoder patterns are made with very close line spacings. This makes the grids expensive, makes mechanical tolerances in the encoders very tight (both distance between grids and parrallelism patterns), and usually requires collimation of the light beams.

Several improvements to this system, as described herein, may be applied, either individually or in combination, to an incremental encoder to improve resolution at lower cost, and to provide additional benefits, as will be indicated. In general, these improvements require some increase in the electronics portions of the encoder as a trade-off for allowing looser tolerances in the encoder grids and mechanical parts and assemblies.

In the following discussion, the parts of the encoder which have the grid patterns are referred to as the stator and the rotor. This is merely a convenient nomenclature, and is not meant to imply that the motion between the two parts must be rotary; it could apply as well to the two parts of a linear transducer. Also, the term "stator" is not meant to imply that this part is stationary. Only relative motion between the two parts is important, so either or both of the parts may move.

What is required by the industry is an encoder which can accurately subtract the bias and distinguish position between zero crossing points. This would allow a less accurate, and therefore, less expensive, grid to be used and simultaneously improve system operation. Several configurations of grid combinations are described herein which take advantage of more complex electronic circuits to allow the use of less accurate grids.

DESCRIPTION OF THE DRAWINGS

FIG. 6 shows the waveshapes generated by the circuit of FIG. 4.

DETAILED DESCRIPTION OF THE DRAWINGS

Figure 1:
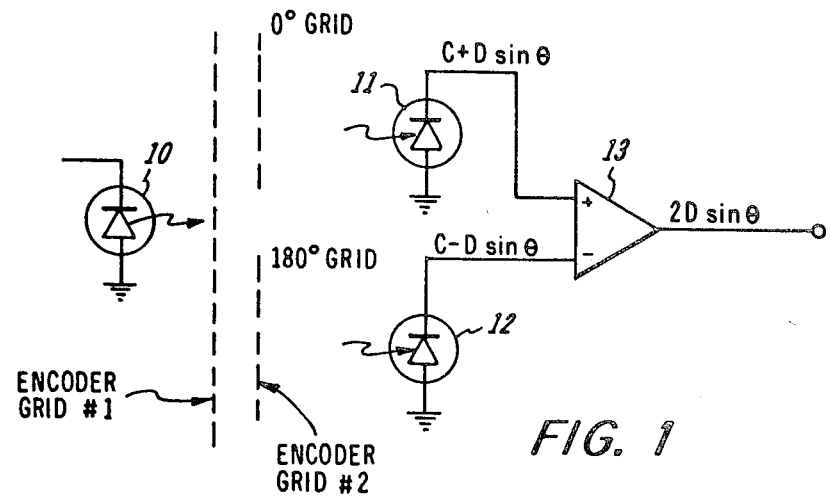
FIG. 1 is a circuit for automatically cancelling the bias.

FIG. 1 is an improved encoder circuit for subtracting the bias level from the sensor output. The grid pattern on Grid #2 of the encoder is divided into two segments, so that its output is shifted 180 degrees from the normal output. This method requires at least one light source 10 and two sensors 11, 12. The FIG. 1 circuit assumes a sinusoidal output but any periodic pattern can be used. A difference amplifier 13 is shown for subtracting the outputs from the two sensors; however, this function may be provided by a push-pull arrangement of the two sensors so that a separate amplifier 13 may not be required. In either case the bias, C, will be removed automatically from the output.

Figure 2:
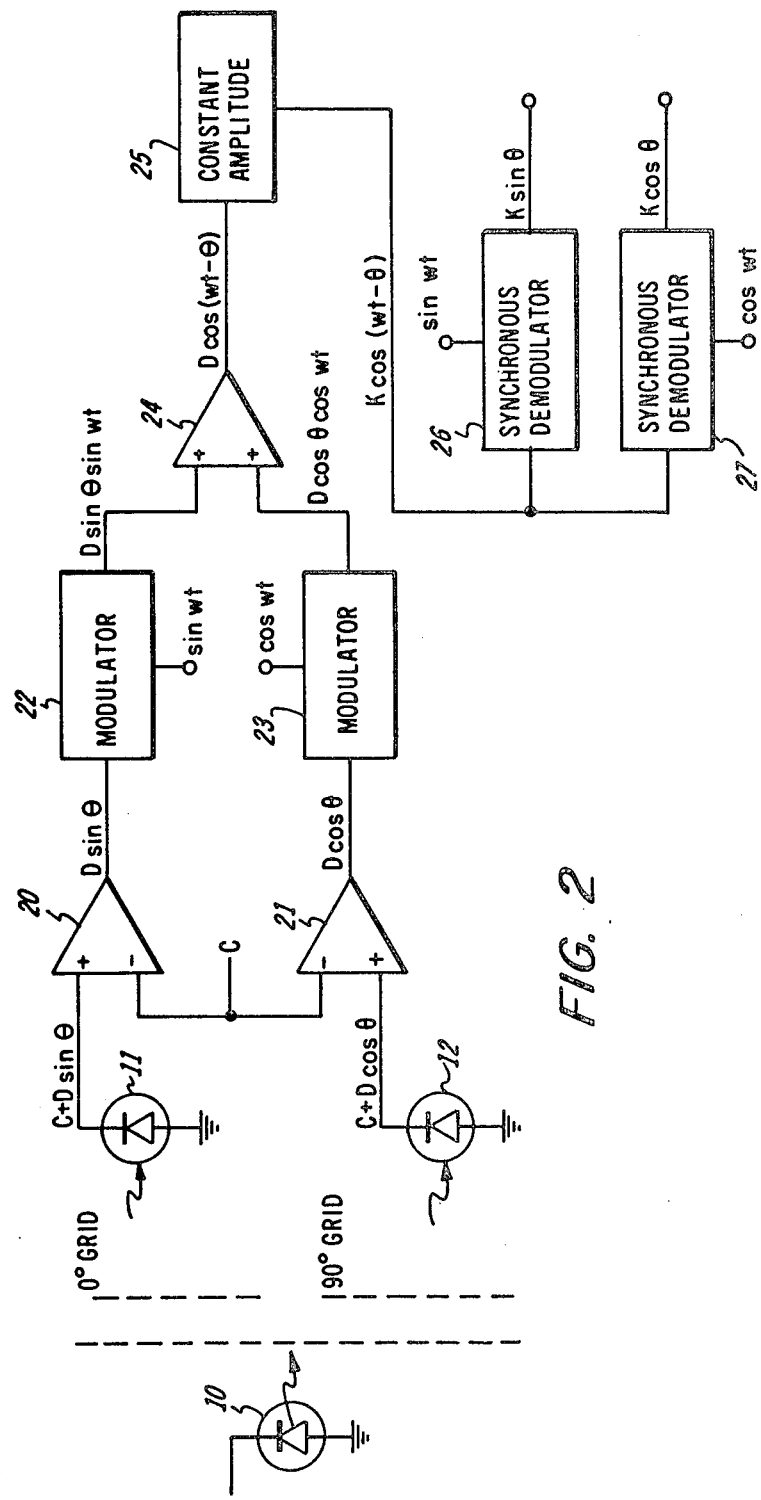
FIG. 2 is a circuit which automatically cancels the effects of any amplitude variations which are common to all detectors.

A further improvement accomplished by the modulation and demodulation of the signals to create an output insensitive to the average signal amplitudes is shown in FIG. 2. One grid is divided into two segments, one ninety degrees out of phase with the other. The sensor 11, 12 outputs are designated as sine and cosine, although these signals need not be sinusoidal. The bias level C is subtracted from these signals by any convenient method, here differential amplifiers 20, 21 are used, and the resulting sine and cosine waves are applied to modulators 22, 23 as shown.

The carrier signals, designated sin $\omega\tau$ and cos $\omega\tau$ input to the modulators 22, 23 are quadrature-related, and are a much higher frequency than the highest sine $\theta$ and cos $\theta$ frequency. While these carrier signals are designated as sine and cosine waves in FIG. 2, they may be any convenient waveform, including square waves.

The outputs of the modulators 22, 23, as shown, are added in amplifier 24 to yield D cos $(\omega\tau-0)$, and then amplitude limited by any convenient constant amplitude means 25 to yield a constant amplitude signal at the carrier frequency, with the encoder position providing the phase shift. Finally, sin $\omega\tau$ and cos $\omega\tau$ are removed at demodulators 26, 27 to recover the original position information K sin $\theta$ and K cos $\theta$, but now independent of the light level of the encoder.

In other words, a carrier is used to convert the original position information to a phase shift, the signal is amplitude limited at that point and then the phase shift is converted back to the original sine and cosine positional information, but now without sensitivity to any effects which might cause the signal amplitudes to change equally.

In FIG. 2, the signals are depicted as though the modulators 22, 23 were multipliers. This is not meant to be a restriction. Any convenient modulator might be used, but it should allow for recovery of the input signal without significant distortion. Note, however, that the modulation can be included in the system at any point preceeding the summation of the quadrature signals. In particular, the modulation might even be at the light source. In this case, it might be convenient to have two light sources, each modulated with, possibly, square waves (½ time on and ½ time off) with a quadrature phase relationship, and each source directed to one of the grid pattern segments. In any event, no matter where the modulation takes place, the carrier frequency should be higher than the maximum frequency to be incurred in the variation of the encoder transmission factor as the encoder is rotated or moved.

The signals out of the synchronous demodulators 26, 27 are indicated as sinusoidal functions of the encoder position in FIG. 2. This will be the case if the input signals are sinusoidal and the demodulator is a multiplier followed by a low pass filter. Other combinations of signal waveforms and detector types will produce differing output functions. In particular, if the demodulator input signals are square waves, and the demodulator is an exclusive—or logic circuit, followed by a low pass filter, the output will be a triangular wave as the encoder is moved. (The output will be a linear increasing function of $\theta$ for one-half a period, corresponding to the encoder grid spatial frequency, and a linear decreasing function for the other half.) This allows a further improvement in the encoder. The triangular signals can be differentiated and appropriately switched to give an output proportional to the velocity of the encoder motion. Thus, if quadrature triangular signals are available from two or more demodulators, the encoder can provide:

(a) Increment distance measurements counted from the zero crossings of the triangular signals, (b) Position information between increments, obtained from the relative amplitudes of the triangular signals (which have been rendered insensitive to light levels), (c) Direction of motion, determined by noting the consecutive changes in polarity of the triangular signals, and (d) Velocity information (which has also been rendered insensitive to light levels.)

In the above improvements, insensitivity to bias level and to light level has been obtained by comparing two or more signals that have been generated by somewhat similar methods, and thus have approximately equal bias levels and signal component amplitude levels. Thus, the light sources, sensors, amplifiers, etc., used in the parallel channels should have gains and offsets suitably matched and tracked to provide accurate cancellation. In particular, the patterns on the several grid segments should be matched for equal amplitudes of transmission function. This requirement, which is usually easiest met by making the segments small, must be compromised with the requirements for adequate light transmission and for an accurate transmission waveform as a function of relative encoder motion. These latter two requirements are easiest met by making the segments large. One method for obtaining both results is by providing many segments at each phase, interspersed with segments at the other phases. The necessary light paths can then be connected using optical fibers.

By using the techniques already disclosed, the encoder is able to give position information between the increments established by the spatial period of the encoder pattern. Therefore, the spatial period can be increased and still result in an encoder with equivalent distance resolution. With an increased spatial grid period:

(a) The mechanical tolerances such as parallel alignment and grid spacing can be relaxed, (b) Light collimation requirements can be relaxed, (c) The grids can be designed with a continuously varying density pattern so that the transmission factor with respect to encoder motion is a well defined function, and (d) The grid densities and pattern dimension tolerances over large areas can be relaxed, subject only to the requirement for matching within areas covered by the various phase-shifted segments.

Figure 3:
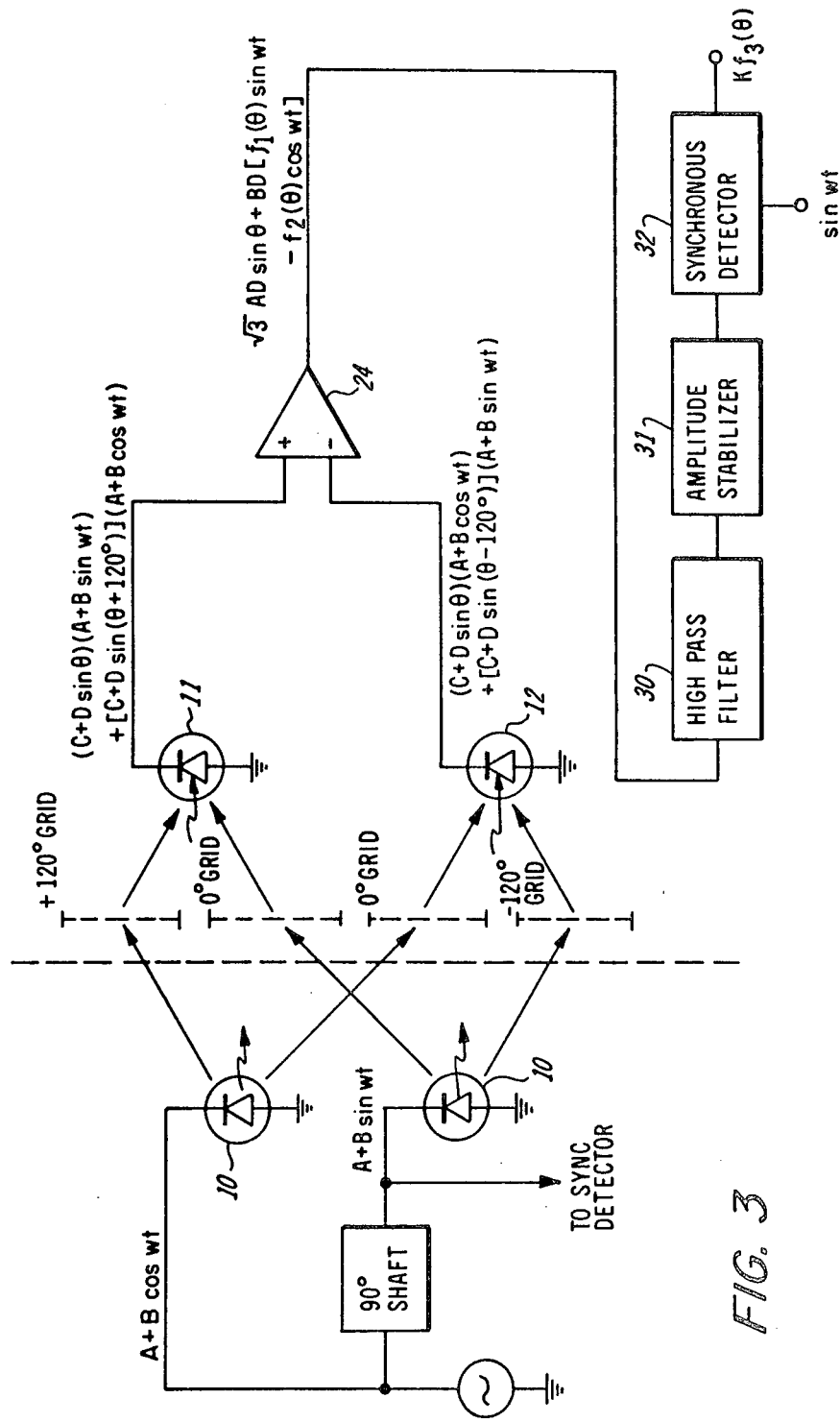
FIG. 3 is a circuit for both cancelling the bias and removing amplitude sensitivity.

The improvements herein disclosed can be combined in various ways to achieve encoder systems with many different configurations and characteristics. For example, FIG. 3 shows an encoder with grid segments at three different phases that provides both for cancellation of the bias level and for insensitivity to light level in its two sensors.

In this circuit, the carrier frequency is injected at the light sources 10 so that the sensor 11, 12 outputs are a function of the grid position sin $\theta$, as well as the carrier frequency, sin $\omega\tau$. The sensor 11, 12 outputs are subtracted at amplifier 24 to produce various functions of $\theta$ and $\omega\tau$. Then, the $\sqrt{3}$ AD sin $\theta$ term is removed at the high pass filter 30, the amplitude is limited at amplitude stabilizer 31 and the sin $\omega\tau$ and cos $\omega\tau$ carrier terms are removed at the synchronous detector 32 to produce a final term which is a function of the grid position, $\theta$, but which is independent of light level and modulation amplitude.

Figure 4:
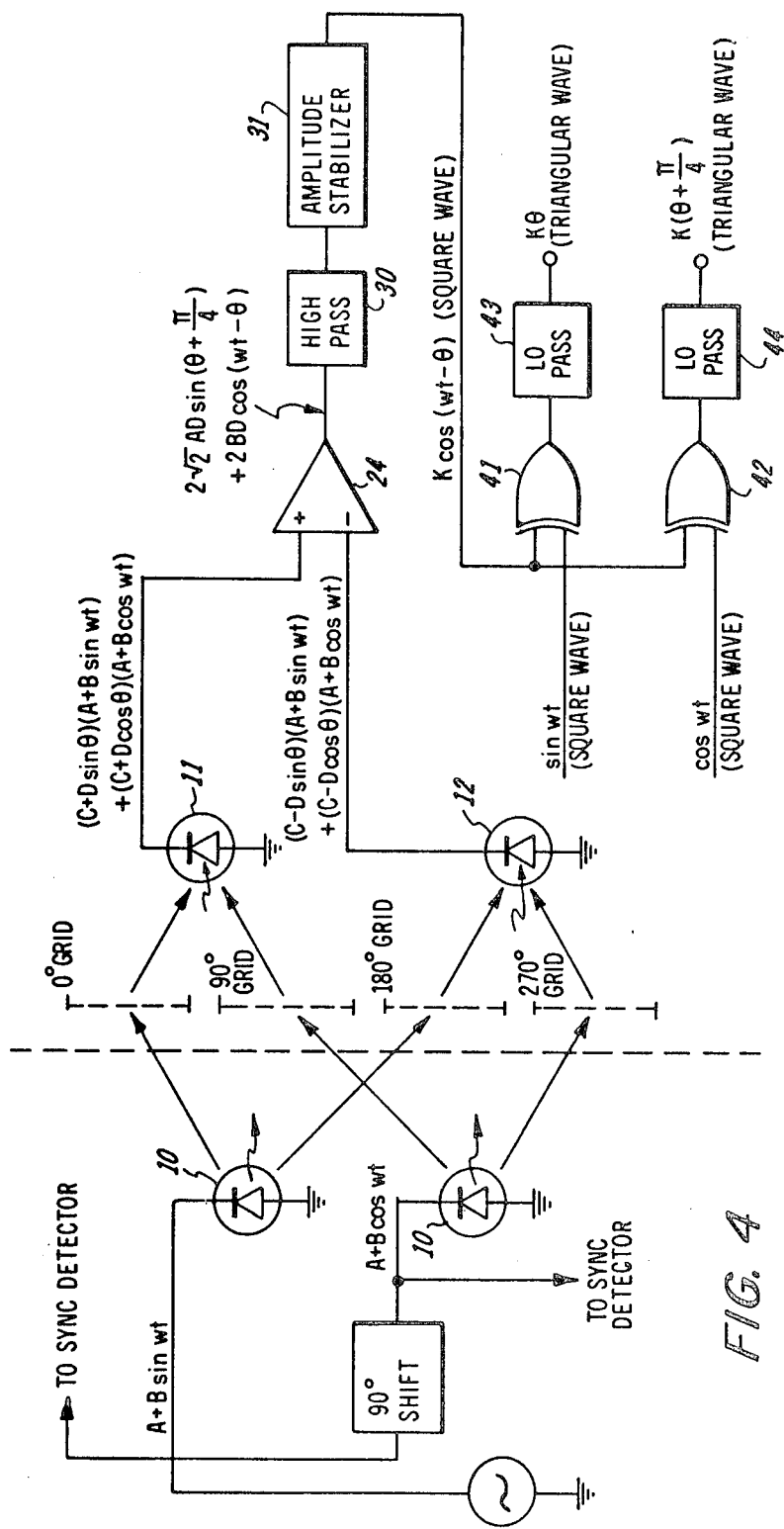
FIG. 4 is a circuit which produces a triangular waveshape as the output.

FIG. 4 shows an encoder with four encoder grid phases. Here the sources 10 are driven at the carrier frequency to produce light characterized as a bias level A plus a carrier signal B sin ωτ or B cos ωτ. The light passes through the grids as shown to produce the sensor 11, 12 outputs which are functions of the encoder position θ and the carrier signal. These are subtracted in amplifier 24, the low frequency components (sin θ term) are blocked at the high pass filter 30, and the amplitude is limited at amplitude stabilizer 31. The resultant output, a square wave approximated by an amplitude limited K cos (ωτ−θ), is then exclusive—ORed at gates 41, 42 with a squared-off sin ωτ. These two inputs are shown on lines A and B of FIG. 6, and the output of the exclusive OR gate is shown as line C. This is coupled through a low pass filter 43, 44 to produce the waveshape of FIG. 6, line D.

In this case, the instantaneous amplitude of the two quadrature outputs can be used to determine position, velocity and motion direction.

Figure 5:
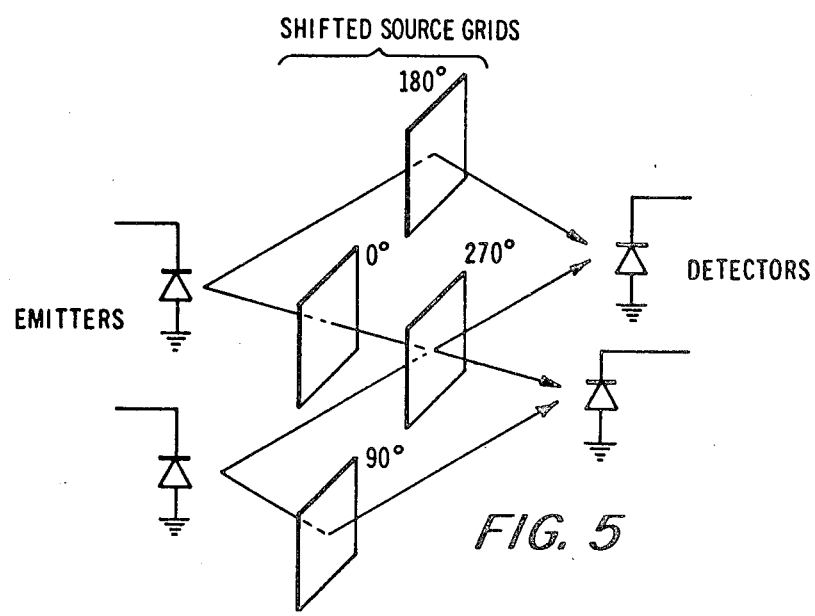
FIG. 5 is an alternate grid arrangement.

FIG. 5 shows one possible arrangement for the physical relationships of these four segments of the grids of FIG. 4. In all of these examples, the grid phases are equally spaced around the spatial period. However, that need not be the case. The grids can be placed as other phases provided the appropriate gains are included in the other parts of the circuit to yield the desired cancellations.

Figure 7:
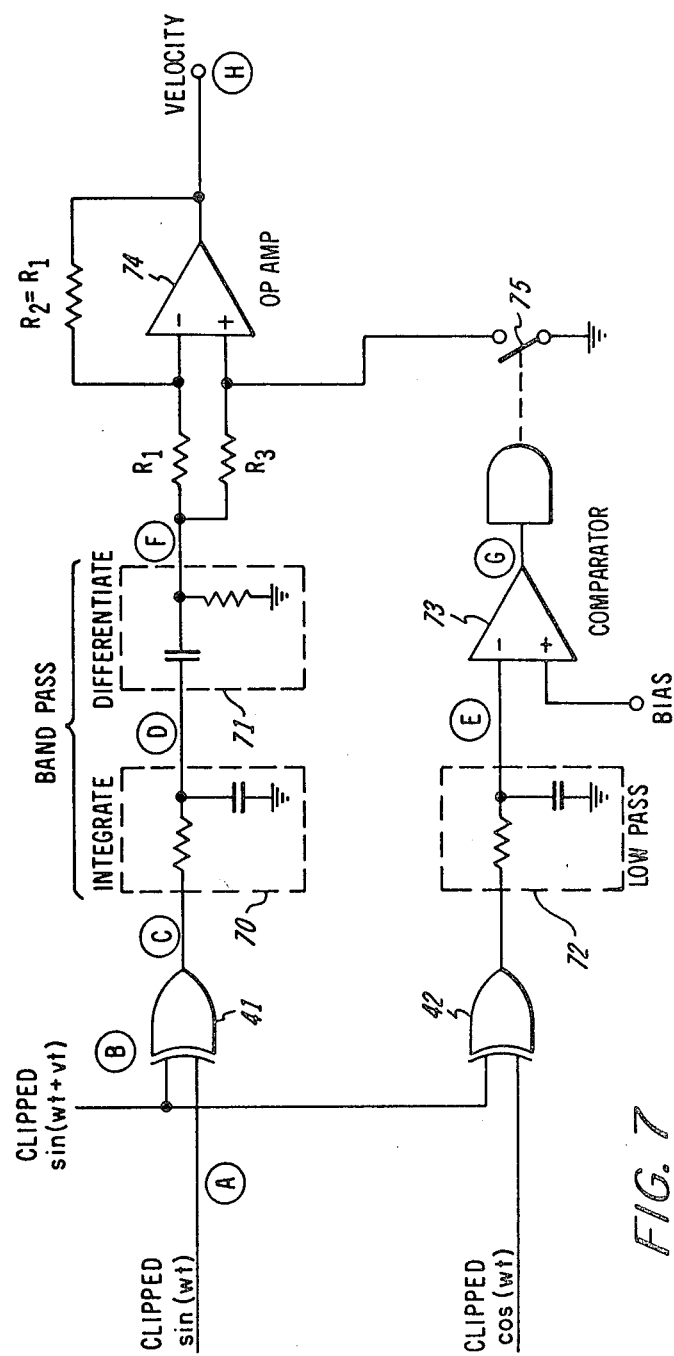
FIG. 7 is another circuit for producing a triangular waveshape output.

FIG. 7 is a circuit for producing a velocity output. The inputs to the exclusive OR gates 41, 42 are squared off carrier signals, sin ωτ and cos ωτ, and one squared off sensor output, sin (ωτ+υτ) where υτ=θ. The output of gate 41 is that shown in FIG. 6, line C. This is integrated in low pass filter 70 to yield the waveshape at FIG. 8, line D and differentiated at high pass filter 71 to yield the waveshape at line F of FIG. 8.

Figure 8:
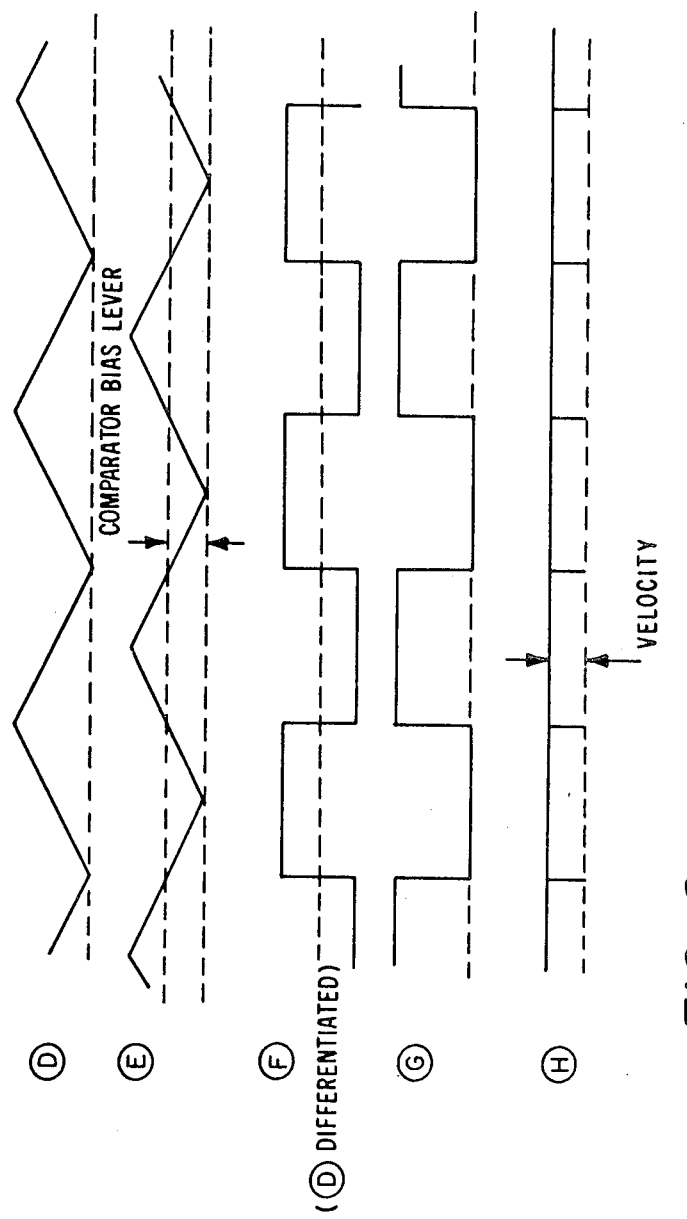
FIG. 8 shows the waveshapes generated by the circuit of FIG. 7.

At the same time, exclusive OR gate 42 receives the cos (ωτ) and sin (ωτ+υτ) signals and produces a waveshape which, when integrated, produces the waveshape of FIG. 8, line E. This is squared at comparator 73 to produce the line G waveshape. This waveshape has an amplitude approximate to close switch 75 whenever the signal of line E is below the comparator bias level, and to open the switch whenever the signal is above the bias. The resultant effect is to switch the gain, created by amplifier 74 with its associated resistors, alternately from +1 to −1, in synchronism with the changes in polarity of the signal in line F. This causes amplifier 74 to rectify the signal of line F to produce an output voltage which is proportional to the rate of change of υt. The polarity of the output voltage is determined by the polarity of υ. Therefore, this circuit signals both the magnitude and direction of the velocity for any encoder motion. The circuit of FIG. 7 could also be used as the synchronous detector 32 in FIG. 3.

The point of these circuits is to combine the signals from at least two light paths, through encoder grids that are spatially shifted in phase, so that any bias level will be cancelled by signal components that are 180° out of phase, and position, velocity and direction information will be conveyed by the quadrature components. Any amplitude changes which affect all paths in common will be removed by modulating the signals with a carrier frequency, amplitude limiting the modulation products, and synchronously detecting the result to retrieve the angular information.

While the invention has been described with reference to specific embodiments, it will be understood by those skilled in the art that various changes will be made and equivalents may be substituted for elements thereof without departing from the true spirit and scope of the invention. In addition, many modifications may be made without departing from the essential teachings of the invention.

What is claimed is:

1. An optical position encoder which indicates position continuously between zero crossings comprising:
   a constant light source,
   a first encoder grid,
   a second encoder grid,
   a second encoder grid comprising two segments, the second segment 90 degrees out of phase with the first,
   a first light sensor positioned so that it receives light transmitted through the first encoder grid and the first segment of the second encoder grid,
   a second light sensor positioned so that it receives light transmitted through the first encoder grid and the second segment of the second encoder grid,
   a first modulator for modulating the output of the first sensor at a first carrier frequency,
   a second modulator for modulating the output of the second sensor at a second carrier frequency which is 90 degrees out of phase with said first frequency,
   means for adding the modulated outputs,
   means for amplitude limiting the output of said means for adding, and
   two parallel demodulators for removing the carrier frequencies from the output of said means for amplitude limiting to produce two output signals which vary continuously between zero crossings as a function of position.

2. The circuit of claim 1 further comprising an amplifier for coupling the output of each sensor to its associated modulator, said amplifier for subtracting an electrical bias level from each sensor output.

3. An optical position encoder which indicates position continuously between zero crossings comprising:
   a first light source modulated at a first carrier frequency,
   a second light source modulated at a second carrier frequency 90 degrees out of phase with said first carrier frequency,
   a first encoder grid,
   a second encoder grid comprising four segments, the first segment 120 degrees, and the fourth segment 240 degrees out of phase with the second and third segments,
   a first sensor positioned to receive light from said first source through said first encoder grid and said first and second segments of said second grid,
   a second sensor positioned to receive light from said second source through said first encoder grid and the third and fourth segments of said second grid,
   an amplifier for subtracting the outputs of said first and second sensors,
   a high pass filter for removing the low frequencies from said amplifier output,
   an amplitude stabilizer for amplitude limiting the output of said filter, and
   a synchronous detector for removing the carrier frequency from the amplitude stabilizer output to produce a position indicating electrical signal.

4. The circuit of claim 3 wherein said synchronous detector comprises:

two exclusive OR gates, each comprising a first input coupled to said amplitude stabilizer output, and a second input coupled to a carrier frequency signal, and two low pass filters, one coupled to the output of each gate.

5. The circuit of claim 4 further including a differentiator to differentiate the output of one of said low pass filters to produce an output proportional to the encoder velocity.

6. An optical velocity encoder comprising:

a first exclusive OR gate having inputs of a clipped sin $(\omega\tau+\upsilon\tau)$ and a clipped sin $\omega\tau$ and a second exclusive OR gate having inputs of a clipped sin $(\omega\tau+\upsilon\tau)$ and clipped cos $\omega\tau$ where sin $\omega\tau$ and cos $\omega\tau$ are carrier frequency signals and sin $\upsilon\tau$ is an optical position encoder output, a first integrator to remove the carrier frequency component from the output of the first exclusive OR circuit to produce a triangular waveshape, a differentiator to convert the output of said first integrator to a square wave, the amplitude being a function of the rate of change of the output of said first integrator, a second integrator to remove the carrier frequency component from the output of the second exclusive OR circuit to produce a triangular waveshape, a comparator for comparing positive and negative portions of the output of said second integrator to a zero reference to convert said positive and negative waveshapes into a positive and negative going square wave, and means responsive to the comparator output for switching the polarity of the output of said differentiator.

* * * * *